(12) United States Patent
Burke et al.

(10) Patent No.: US 7,851,361 B2
(45) Date of Patent: Dec. 14, 2010

(54) LASER ABLATION TO SELECTIVELY THIN WAFERS/DIE TO LOWER DEVICE $R_{DSON}$

(75) Inventors: Hugo R. G. Burke, PontyClun (GB); Robert Montgomery, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 67 days.

(21) Appl. No.: 11/636,762

(22) Filed: Dec. 11, 2006

(65) Prior Publication Data

US 2007/0210407 A1    Sep. 13, 2007

Related U.S. Application Data

(60) Provisional application No. 60/748,891, filed on Dec. 9, 2005.

(51) Int. Cl.
*H01L 21/44* (2006.01)
*H01L 21/302* (2006.01)
*H01L 21/461* (2006.01)
*C03C 15/00* (2006.01)
*C03C 25/68* (2006.01)

(52) U.S. Cl. ............ 438/690; 438/666; 438/668; 438/977; 216/94

(58) Field of Classification Search ............ 216/94, 216/52–53; 438/666–668, 688, 463, 597, 438/691–692, 589, 977
See application file for complete search history.

(56) References Cited

U.S. PATENT DOCUMENTS

| 6,574,863 | B2 * | 6/2003 | Tung et al. ............ 29/846 |
| 7,485,910 | B2 * | 2/2009 | Kim et al. ............ 257/302 |
| 2002/0086137 | A1 * | 7/2002 | Brouillette et al. ...... 428/138 |
| 2003/0037815 | A1 * | 2/2003 | Kim et al. ............ 136/256 |

* cited by examiner

*Primary Examiner*—Ha Tran T Nguyen
*Assistant Examiner*—Valerie Brown
(74) *Attorney, Agent, or Firm*—Farjami & Farjami LLP

(57) ABSTRACT

A laser ablated wafer for a semiconductor device, such as a MOSFET or other power device, and a method of producing such a wafer to achieve a lower electrical resistance are provided. The method includes forming first holes, slots or trenches on a first surface of the wafer and focusing a laser beam to form second trenches on a bottom surface of the wafer, and filling the trenches, for example using aluminum or other metallic filling, to provide conductive electrodes or conductive surfaces for the semiconductor device. In such a wafer each trench on the second surface may be deeper, for example more than one hundred microns deep and tens of microns wide.

20 Claims, 2 Drawing Sheets

LASER ABLATION TO SELECTIVELY THIN WAFERS/DIE TO LOWER DEVICE $R_{DSON}$

RELATED APPLICATION

The present application claims priority from U.S. Provisional Application No. 60/748,891 filed on Dec. 9, 2005, which is incorporated in full by reference herein.

FIELD OF THE INVENTION

This invention relates to semiconductor device processing, and more specifically relates to the selective ablation and thinning of semiconductor wafers, to wafers so produced, and to laser ablation techniques for semiconductor wafers.

BACKGROUND OF THE INVENTION

Semiconductor die are commonly simultaneously processed and formed in the surface of a wafer of silicon or other semiconductor material, and are subsequently separated from one another in a subsequent dicing operation.

If the die conduct vertically between the top and bottom surfaces, the die thickness presents electrical resistance ($R_{DSON}$). In order to reduce $R_{DSON}$ it is common to thin the wafer, for example from about 350 μm to 50 μm or less.

The wafer thinning operation uses mechanical grinding or wet etching. Both of these processes are complex, time consuming and expensive. Further, excessive or incorrect thinning may lead to weak, fragile, thin wafers that break or fracture easily during production, installation or use.

SUMMARY OF THE INVENTION

A laser ablated wafer for a semiconductor device, and a method of producing such a wafer to achieve a lower electrical resistance, are provided. The method includes forming a standard device on a first surface of the wafer and focusing a laser to form holes or trenches on a bottom surface of the wafer, and filling the holes or trenches to provide conductive surfaces for the semiconductor device.

In such a wafer each hole or trench on the second surface may be much deeper and wider than those on the first surface. For example, each trench on the second surface may be more than a hundred microns deep and tens of microns wide. Such a substrate may be approximately 350 μm or less in thickness.

The method may further entail etching or grating (or both) at least one of the first surface or the second surface before the laser ablation.

The filling of the holes or trenches may be a metallic material, such as aluminum or aluminum alloy.

DETAILED DESCRIPTION OF THE INVENTION

Figure 5:
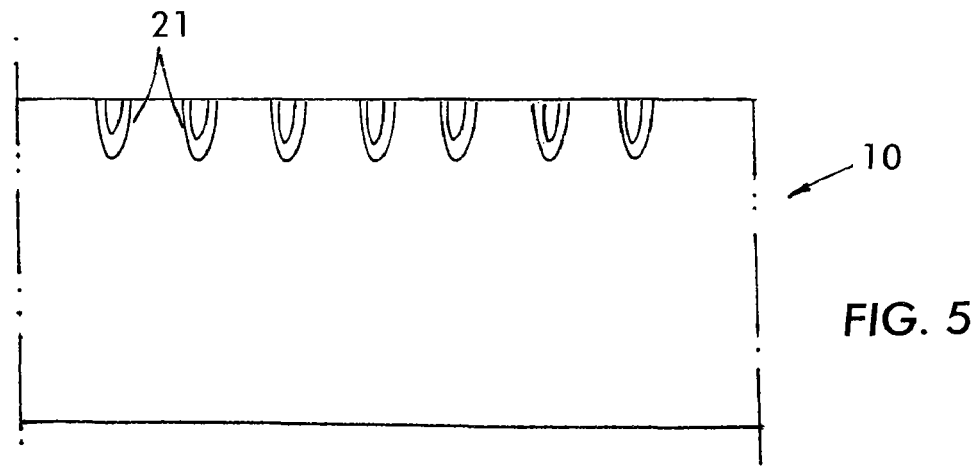
FIG. 5 is a section view of the silicon wafer of FIG. 1 and illustrates the wafer before laser ablation of trenches of the bottom surface.

In accordance with the invention, a plurality of standard devices 20 are formed in surface 11, that is, on the top surfaces of a wafer 10. The standard devices may be formed and provided with electrodes according to the conventional processes, and the entire active region above the substrate may be formed before the laser ablation. For example, gate structures with an insulation layer inside trenches around electrodes may be formed in the top surface for a vertical conduction MOSFET or other power device. FIG. 5 illustrates such a wafer with the active region formed, including the first trenches 21, but before laser ablation of the second trenches 23.

The laser beam (not shown) is sharply focused to form second trenches 23 on the bottom surface of the wafer 10. The wafer 10 can be somewhat pre-thinned using conventional techniques, such as grinding and/or etching, before the laser ablation to reduce the depth needed for the ablated holes. However, the wafer 10 remains thick enough to retain sufficient mechanical strength for easy handling of the wafer without fracture.

Figure 2:
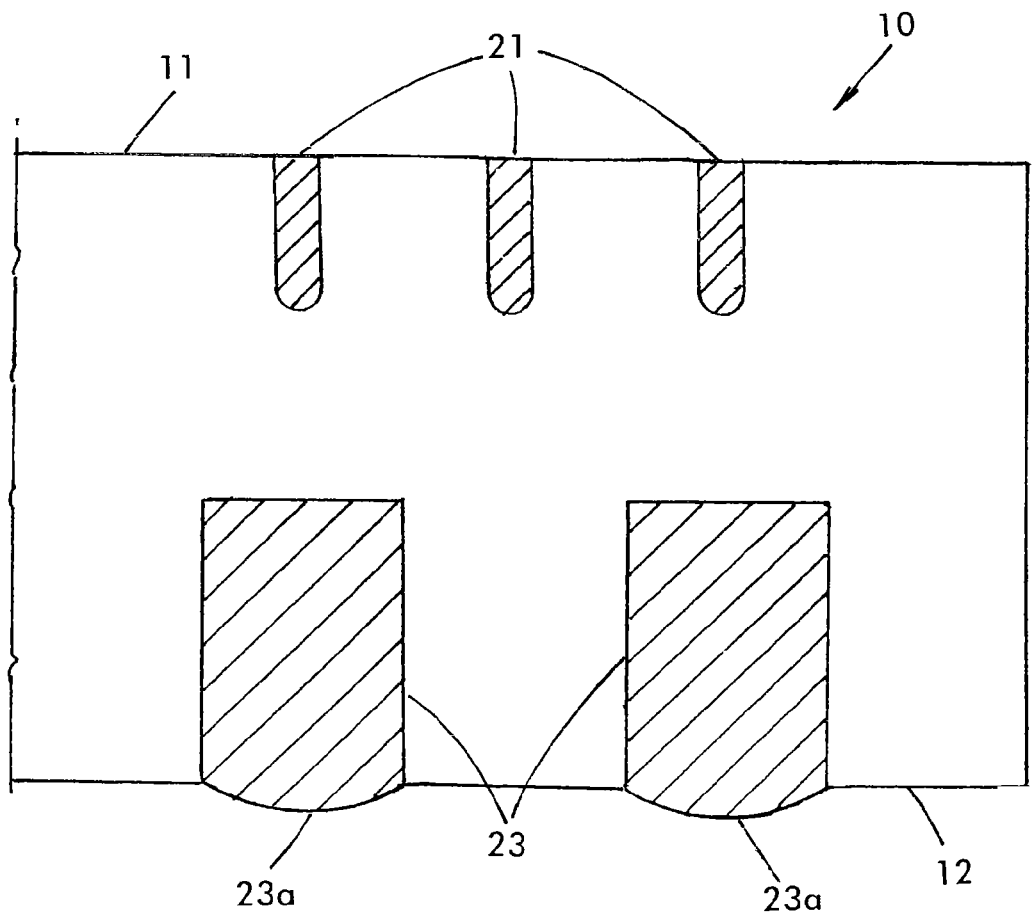
FIG. 2 is a section view of the silicon wafer of FIG. 1 and illustrates standard devices on the top surface of the wafer, and large diameter, deep, laser-ablated trenches that are filled in the bottom surface.

The trenches 23 may be back-filled with a metal, for example, aluminum, after forming to provide conductive surfaces for the die to connect with contacts outside the die, such as contacts of a circuit board or frame or other die. As shown in FIGS. 2, for example, the second trenches 23, shown as deeper and wider, and formed on the second surface 12 of the die have, according to an aspect of the invention, a substantially convex outer surface 23a to facilitate connection with circuit board or other external contacts. Such fillings may also provide a degree of mechanical strength for the wafer. The trenches may be positioned as desired for each die position on the wafer. No wafer patterning is necessarily needed.

The wafer 10 of FIG. 2 may be about 350 μm thick, however, different thicknesses may be used. The first trenches 21, disposed on the top surface 11, may be approximately 20 μm deep (non-critical) and about 3 μm in diameter or width (non-critical). The holes or trenches 23, disposed on the bottom surface 12 of the wafer 10, may be approximately 150 μm deep (non-critical) with a diameter or width of about 30 μm (non-critical). However, each trench may have other dimensions, and trenches of varying dimensions may be formed on the same surface, without departing from the spirit of the invention. Also, the dimensions of the trenches of the top surface may be reversed with those of the bottom surface.

For example, the electrical contacts of the die may be comprised of the fillings in the holes or trenches 23, the deeper and wider trenches formed on the second surface of the die, while the fillings of the first trenches 21 of the first surface 11 may comprise only gate electrodes of the die. However, it will be understood that not every trench need contain an electrical contact or an active electrode structure of the die. That is, depending on the needs of the ablation application, trenches may be provided that have no electrical contact function and/or no functioning electrode structure.

Figure 3:
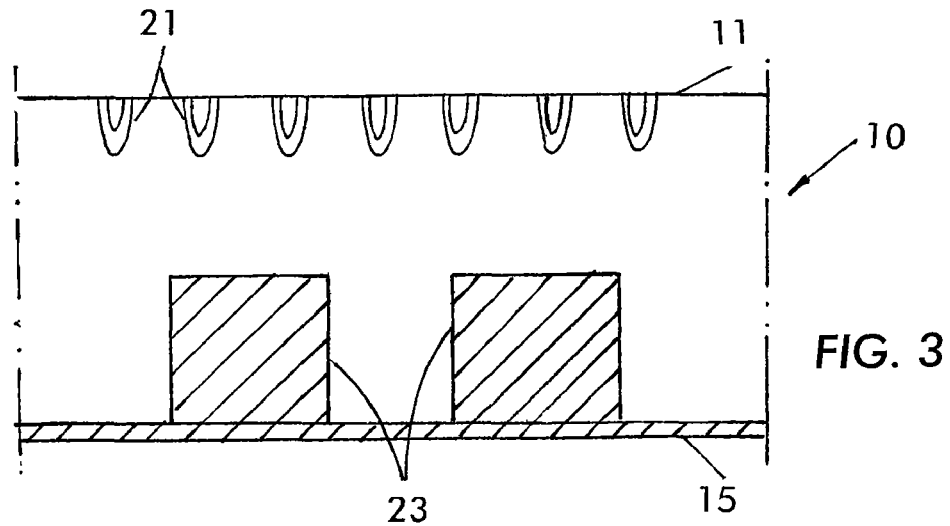
FIG. 3 is a section view of the silicon wafer of FIG. 1 and illustrates a completed wafer, including the backmetal layer formed on the bottom surface.

An example of a completed die is illustrated in FIG. 3. The backmetal layer 15 is sputtered or otherwise deposited along the back surface and inside the second trenches 23 formed on the bottom surface of the substrate. It will be understood that other structures not shown may also be present. A wafer for a planar die is also contemplated using the laser ablated trenches along the bottom surface of the die.

Figure 1:
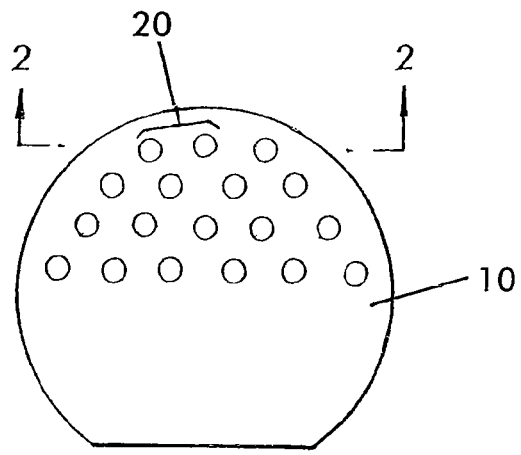
FIG. 1 is a schematic illustration of a top plan view of a silicon wafer after standard devices have been created.

Such a die will typically have a reduced current path and an $R_{DSON}$ of a much thinner wafer than that of FIGS. 1 and 2 while still having the mechanical strength of a much thicker wafer. The larger diameter of the second trenches 23 facilitates good coverage of the entire inside of each trench during the metal deposition process, so as to avoid poorly covered spots along the bottom wall or side walls of each trench, which would tend to increase resistance and the typical attendant problems of increased resistance for the semiconductor device. Also, an overall increase in surface to surface contact between the top surface and the bottom backmetal will be provided.

Figure 4:
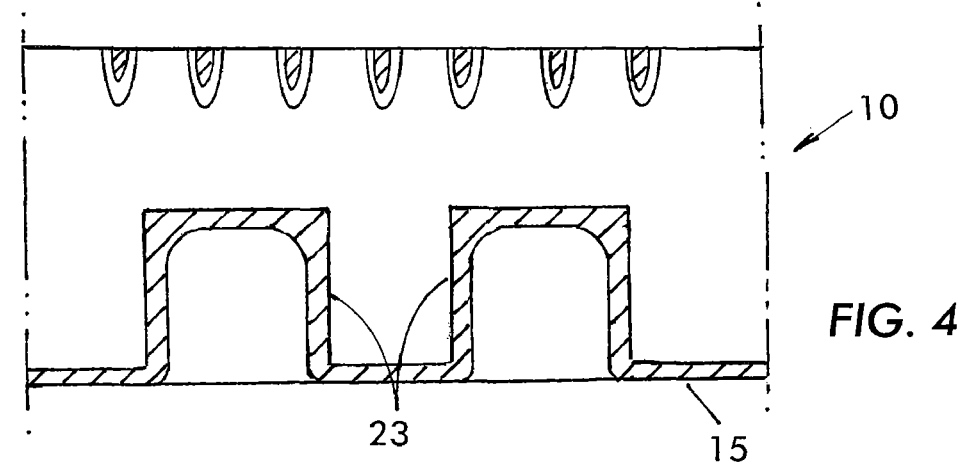
FIG. 4 is a section view of the silicon wafer of FIG. 1 and illustrates an alternate embodiment of the completed wafer with trenches not completely filled with backmetal.

Another embodiment of a completed die is illustrated in FIG. 4. The backmetal layer 15 is sputtered or otherwise deposited along the back surface and inside the second trenches 23, but does not fill all or most of the inside of each trench. As shown, a layer of conductive material, such as metal, is formed to cover all walls of each trench of the second trenches 23. The greater diameter of the trenches facilitates good coverage of the contours of the trench during the metal deposition process. Accordingly, the need to fill with metal most or all of each trench on the bottom surface of the wafer may be eliminated.

Although the present invention has been described in relation to particular embodiments thereof, many other variations, combinations of features, and modifications and other uses will become apparent to those skilled in the art. It is preferred, therefore, that the present invention be limited not by the specific disclosure herein.

We claim:

1. A method of fabricating a semiconductor device, the method comprising:
   forming a first plurality of trenches on a top surface of a wafer;
   forming gate structures inside the plurality of trenches on the top surface;
   focusing a laser beam to form a second plurality of trenches on a bottom surface of the wafer after forming gate structures, each second trench terminating inside the wafer, wherein the entire perimeter of each second trench is adjoined by a substrate of said wafer; and
   filling the second plurality of trenches with metal to provide at least one of conductive electrodes or conductive surfaces for the semiconductor device, said metal in said second plurality of trenches making direct contact with said substrate.

2. The method of claim 1, wherein each trench of the second plurality of trenches on the bottom surface is at least several times deeper and wider than each trench of the first plurality of trenches on the top surface.

3. The method of claim 1, wherein each trench of the plurality of trenches on the bottom surface is more than one hundred microns deep and tens of microns wide.

4. The method of claim 1, further comprising at least one of etching or grating the bottom surface before the forming the plurality of trenches on the bottom surface.

5. The method of claim 1, wherein the substrate is approximately 350 μm or less in thickness.

6. The method of claim 1, wherein each trench of the plurality of trenches on the top surface is approximately 20 μm deep and has a diameter of approximately 3 μm and each trench of the plurality of trenches on the bottom surface is approximately 150 μm deep and has a diameter of approximately 30 μm.

7. The method of claim 1, the filling comprising filling with aluminum.

8. A wafer produced by the method of claim 1.

9. A method for fabricating a semiconductor device, comprising:
   forming an active region on one surface of a wafer;
   laser ablating another surface of the wafer opposite the one surface to obtain a plurality of spaced holes or trenches that terminate inside the wafer, wherein the entire perimeter of each of said spaced holes or trenches is adjoined by a substrate of said wafer; and
   filling said spaced holes or trenches with a metal, said metal in said spaced holes or trenches making direct contact with said substrate.

10. The method of claim 9, wherein said semiconductor device comprises a vertical conduction MOSFET.

11. The method of claim 9, wherein said active region includes a plurality of spaced trenches each including a gate structure formed therein.

12. A method for reducing an electrical resistance between first and second major surfaces of a wafer having semiconductor devices fabricated therein, said method comprising:
   fabricating said semiconductor devices in a first plurality of trenches formed on said first major surface of said wafer;
   laser ablating a second plurality of trenches in said second surface of said wafer, said second surface comprising an exposed substrate of said wafer, each of said second plurality of trenches having sidewalls and a bottom comprised entirely of said substrate;
   depositing a metal layer on said exposed substrate and in a selected plurality of said second plurality of trenches, thereby reducing said electrical resistance between said first major surface and said second major surface of said wafer when compared to another wafer of similar thickness in which said second plurality of trenches is absent.

13. The method of claim 12, wherein each trench of said second plurality of trenches in said second major surface is at least several times deeper and wider than each trench of said first plurality of trenches on said first major surface.

14. The method of claim 12, wherein each trench of said second plurality of trenches in said second major surface is more than one hundred microns deep and tens of microns wide.

15. The method of claim 12, further comprising at least one of etching or grating said second major surface before said laser ablating said second plurality of trenches in said second major surface.

16. The method of claim 12, wherein said substrate is approximately 350 μm or less in thickness.

17. The method of claim 12, wherein each trench of said first plurality of trenches on said first major surface is approximately 20 μm deep and has a diameter of approximately 3 μm and each trench of said second plurality of trenches in said second major surface is approximately 150 μm deep and has a diameter of approximately 30 μm.

18. The method of claim 12, wherein said semiconductor devices comprise vertical conduction MOSFETs.

19. The method of claim 12, wherein said first plurality of trenches on said first major surface comprise spaced trenches each including a gate structure formed therein.

20. The method of claim 12, wherein said selected plurality of said second plurality of trenches comprises substantially all of said second plurality of trenches.

* * * * *